US008468481B2

(12) United States Patent
Nozawa et al.

(10) Patent No.: US 8,468,481 B2
(45) Date of Patent: Jun. 18, 2013

(54) SUPPORT PROGRAM, DESIGN SUPPORT SYSTEM, AND DESIGN SUPPORT METHOD

(75) Inventors: Toshiharu Nozawa, Yokohama (JP); Shigetoshi Wakayama, Yokohama (JP); Mitsuaki Igeta, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/842,710

(22) Filed: Jul. 23, 2010

(65) Prior Publication Data

US 2011/0041113 A1 Feb. 17, 2011

(30) Foreign Application Priority Data

Aug. 11, 2009 (JP) ................................. 2009-186273

(51) Int. Cl.
 *G06F 17/50* (2006.01)
(52) U.S. Cl.
 USPC .......................................................... 716/110
(58) Field of Classification Search
 USPC .................................................. 716/100, 110
 See application file for complete search history.

(56) References Cited

U.S. PATENT DOCUMENTS

| 7,023,091 | B2 | 4/2006 | Funakoshi et al. |
| 7,067,919 | B2 | 6/2006 | Watanabe et al. |
| 7,173,337 | B2 | 2/2007 | Watanabe et al. |
| 7,215,001 | B2 | 5/2007 | Kajita |
| 7,411,301 | B2 | 8/2008 | Funakoshi et al. |
| 2003/0116852 | A1 | 6/2003 | Watanabe et al. |
| 2004/0065961 | A1 | 4/2004 | Funakoshi et al. |
| 2005/0121788 | A1 | 6/2005 | Watanabe et al. |
| 2005/0179062 | A1 | 8/2005 | Kajita |
| 2006/0027928 | A1 | 2/2006 | Funakoshi et al. |
| 2007/0288877 | A1 | 12/2007 | Matsuoka |
| 2008/0086709 | A1 | 4/2008 | Rittman |
| 2008/0303158 | A1 | 12/2008 | Funakoshi et al. |
| 2009/0299718 | A1* | 12/2009 | Amano ........................... 703/14 |
| 2010/0058273 | A1* | 3/2010 | Katagiri ......................... 716/12 |

FOREIGN PATENT DOCUMENTS

| JP | 2003-197623 A | 7/2003 |
| JP | 2004-31439 A | 1/2004 |
| JP | 2005-228882 A | 8/2005 |
| JP | 2007-329361 A | 12/2007 |

OTHER PUBLICATIONS

Young-Bae Park, et al., "Effects of Mechanical Stress at No Current Stressed Area on Electromigration Reliability of Multilevel Interconnects", Jan. 1, 2004, pp. 76-89, vol. 71, No. 1, Microelectronic Engineering, Elsevier Publishers BV., Amsterdam, NL.

* cited by examiner

*Primary Examiner* — Suchin Parihar
(74) *Attorney, Agent, or Firm* — Arent Fox LLP

(57) ABSTRACT

A design support program executed by a computer includes operations of: locating at least one via hole for coupling target wiring in a first layer in circuit information to wiring in a second layer being different form the first layer; calculating an area of the target wiring based on a length and a width of the target wiring; setting a division condition based on the area and a number of the via hole; dividing the target wiring into divided wirings at a position other than a position where the via hole is provided based on the division condition; generating connection information indicating a connection relationship between the divided wirings and limitation information for coupling the divided wirings via a wiring in a third layer being different from the first layer; and outputting the connection information, the limitation information and circuit information obtained after dividing.

5 Claims, 16 Drawing Sheets

| 505 LAYER NAME | 506 NET NAME | 507 WIRING WIDTH | 508 COORDINATE | | | | | | 509 WIRING LENGTH |
|---|---|---|---|---|---|---|---|---|---|
| | | | x | y | x | y | x | y | ... | |
| METAL3 | net1 | 4 | 28 | 40 | 55 | 40 | 55 | 30 | ... | 37 |
| VIA 23 | net1 | - | 30 | 40 | - | - | - | - | - | - |
| VIA 23 | net1 | - | 55 | 32 | - | - | - | - | - | - |

DESIGN TARGET CIRCUIT
······ TO DIFFERENT ELEMENT

FIG. 10

| LAYER NAME (505) | NET NAME (506) | WIRING WIDTH (507) | COORDINATE (508) | | | | | | ... (604) | WIRING LENGTH (509) |
|---|---|---|---|---|---|---|---|---|---|---|
| | | | x | y | x | y | x | y | | |
| METAL3 | net1 | 4 | 28 | 40 | 46 | 40 | - | - | - | 18 |
| METAL3 | net1 | 4 | 47 | 40 | 55 | 40 | 55 | 30 | - | 18 |
| VIA 23 | net1 | - | 30 | 40 | - | - | - | - | - | - |
| VIA 23 | net1 | - | 55 | 32 | - | - | - | - | - | - |

SUPPORT PROGRAM, DESIGN SUPPORT SYSTEM, AND DESIGN SUPPORT METHOD

CROSS-REFERENCE TO RELATED APPLICATIONS

This application claims the benefit of priority from Japanese Patent Application No. 2009-186273 filed on Aug. 11, 2009, the entire contents of which are incorporated herein by reference.

BACKGROUND

1. Field

Embodiments discussed herein relate to design support for designing a semiconductor integrated circuit.

2. Description of Related Art

A disconnection failure occurs in a wiring of a semiconductor integrated circuit when metal atoms move due to a stress which is called as stress migration. Inter-wiring connection through a plurality of via holes referred to as multiple via holes may reduce the influence of stress.

Related art is disclosed in Japanese Laid-open Patent Publication No. 2005-228882, Japanese Laid-open Patent Publication No. 2004-31439, Japanese Laid-open Patent Publication No. 2003-197623, etc.

SUMMARY

According to one aspect of the embodiments, a design support program stored in a computer-readable recording medium, which is executed by a computer, includes operations of: locating at least one via hole for coupling target wiring in a first layer in circuit information to wiring in a second layer being different form the first layer; calculating an area of the target wiring based on a length and a width of the target wiring; setting a division condition based on the area and the number of the via hole; dividing the target wiring into divided wirings at a position other than a position where the via hole is provided based on the division condition; generating connection information indicating a connection relationship between the divided wirings and limitation information for coupling the divided wirings via a wiring in a third layer being different from the first layer; and outputting the connection information, the limitation information and circuit information obtained after dividing.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 10 illustrates exemplary circuit information.

DESCRIPTION OF EMBODIMENTS

Whether or not a failure occurs in wiring and a via hole under the influence of stress migration is checked based on an area of wiring per a via hole, and it is determined whether or not the wiring is divided.

Figure 1:
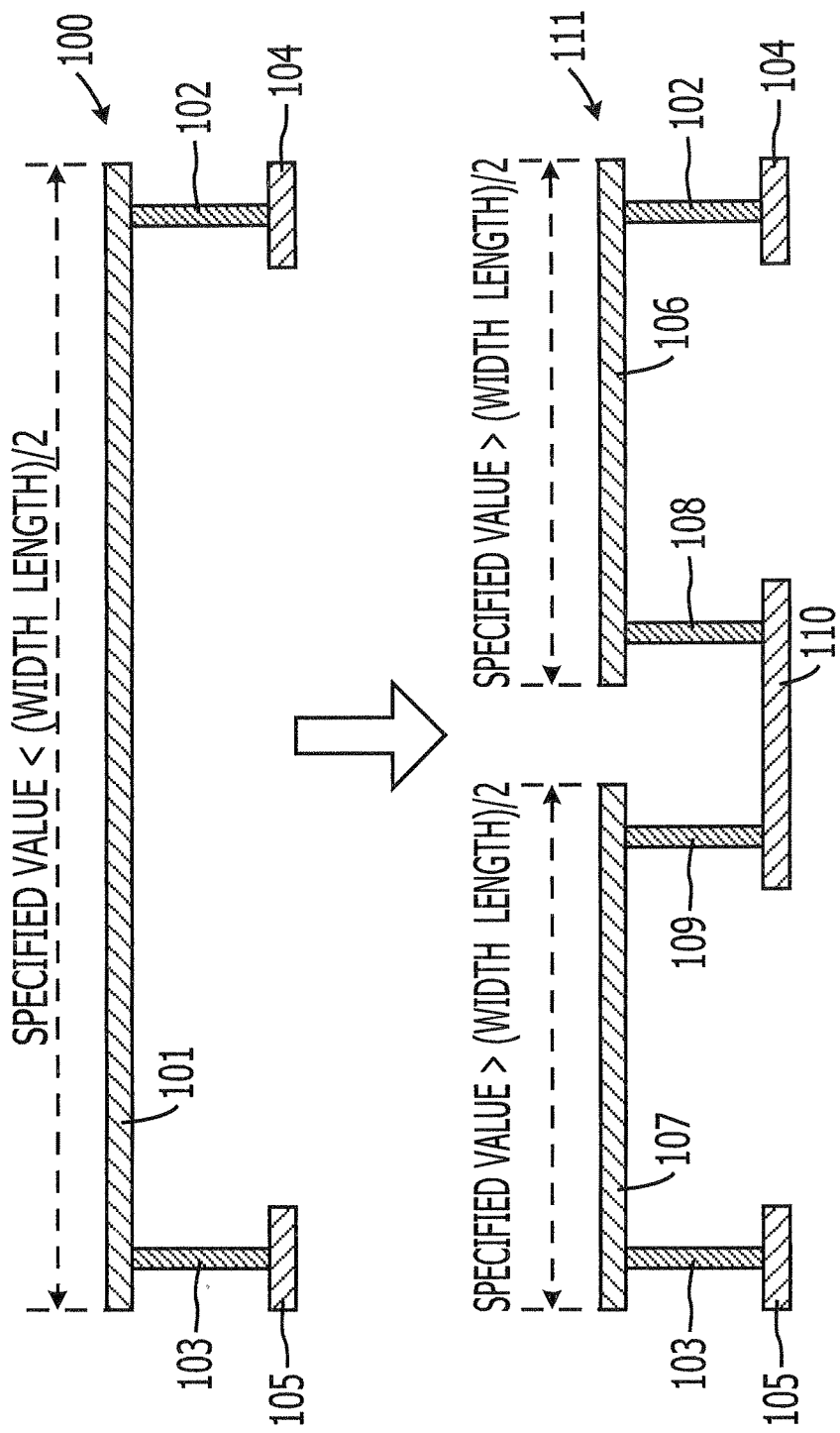
FIG. 1 illustrates an exemplary aspect in accordance with embodiments.

FIG. 1 illustrates an exemplary aspect in accordance with embodiments. Circuit information 100 illustrates a cross section of part of layout data of a design target circuit. Note that "circuit information," as used herein, may refer to, for example, circuit layout information, among other things. According to the circuit information 100, target wiring 101 is coupled to wiring 104 in a lower layer by a via hole 102, and is coupled to wiring 105 in the lower layer by a via hole 103.

The area of the target wiring 101 is calculated based on the length and the width of the target wiring 101. Via holes coupling the target wiring 101 to wiring of a different layer include via holes 102 and 103. The area of the target wiring 101 per via hole is calculated based on the area of the target wiring 101 and a number of via holes, and it is determined whether or not the calculated area is larger than a certain area of wiring per via hole. Since the calculated area is larger than the certain area, each of the target wiring 101 and the via holes 102 and 103 may be determined to be a failure.

The target wiring 101 is divided at a position other than the positions where the via holes 102 and 103 are provided. According to circuit information 111, the target wiring 101 is divided into target wiring 106 and target wiring 107. The target wiring 106 and the target wiring 107 are coupled to each other through via holes 108 and 109 and wiring 110 in a lower layer. The area of wiring per via hole may be reduced so that the failure occurrence may be reduced.

Figure 2:
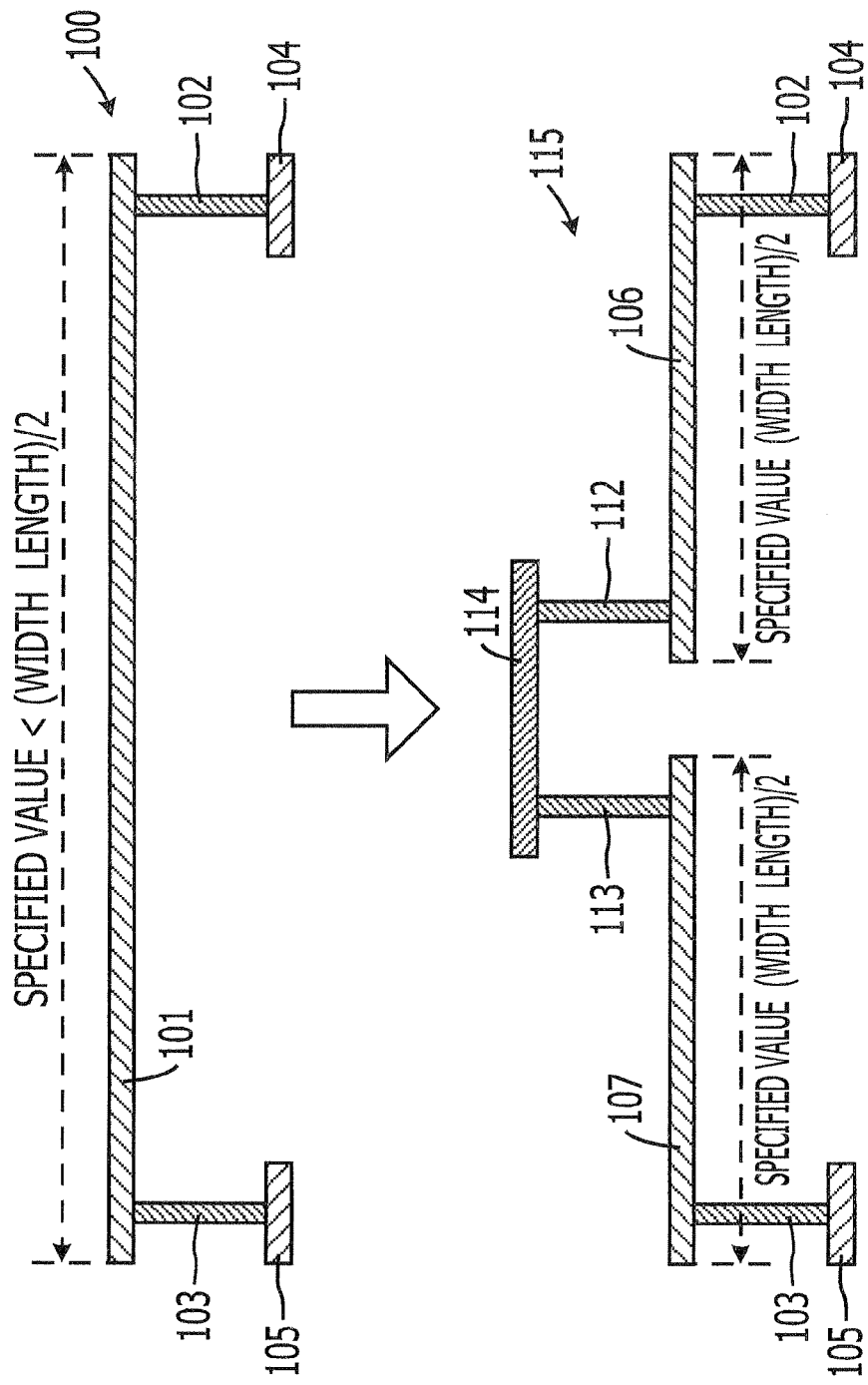
FIG. 2 illustrates an exemplary aspect in accordance with embodiments.

FIG. 2 illustrates an exemplary aspect in accordance with embodiments. As illustrated in FIG. 2, there is no available space in wiring in a lower layer in the circuit information 100. Circuit information 115 illustrates a cross section of part of the layout data of a design target circuit. In the circuit information 115, the target wiring 106 and the target wiring 107 are obtained by dividing the target wiring 101 are coupled to each other through via holes 112 and 113 and wiring 114 in an upper layer.

When the wiring 106 and the wiring 107 that are obtained by the division are not coupled to each other via the wiring 110 in the lower layer, the wiring 106 and the wiring 107 are coupled to each other via the wiring 114 in the upper layer. Consequently, the wiring area per via hole may be reduced.

Figure 3:
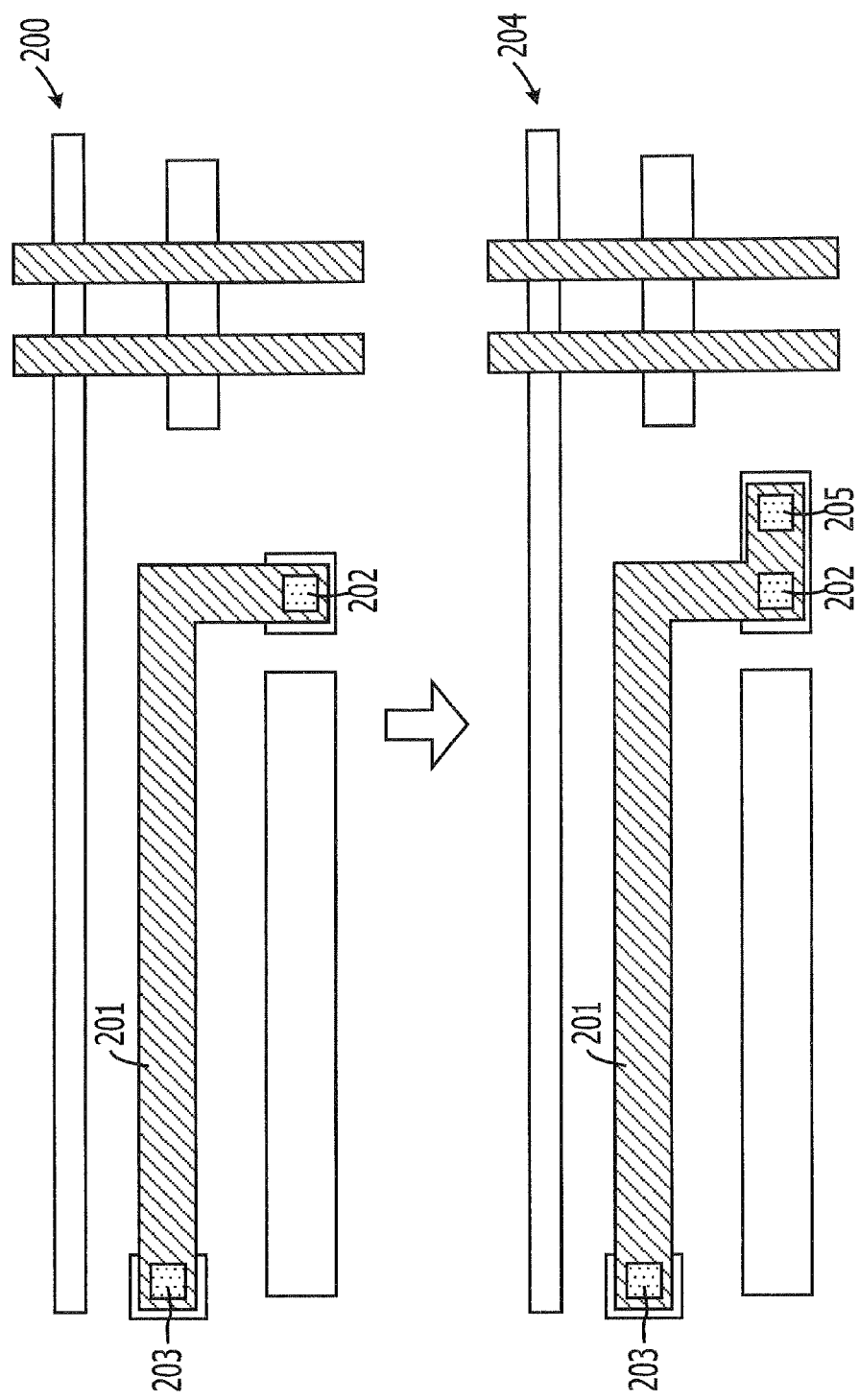
FIG. 3 illustrates exemplary multiple via holes.

FIG. 3 illustrates exemplary multiple via holes. Circuit information 200 illustrates part of the layout data of a design target circuit. Target wiring 201 in the circuit information 200 is coupled to wiring in a lower layer through a via hole 202 or a via hole 203. For example, since the value of the area of the target wiring 201 per via hole is larger than a certain value, each of the target wiring 201, and the via holes 202 and 203 may be a failure. There is a wiring area in the same layer and the lower area on the right side of the via hole 202. In circuit information 204, the target wiring 201 is coupled to wiring in a lower layer via the via hole 202 and a via hole 205. Since the via holes 202 and 205 couple the target wiring 201 to the wiring in the lower layer, the via holes 202 and 205 are referred to as multiple via holes.

Figure 4:
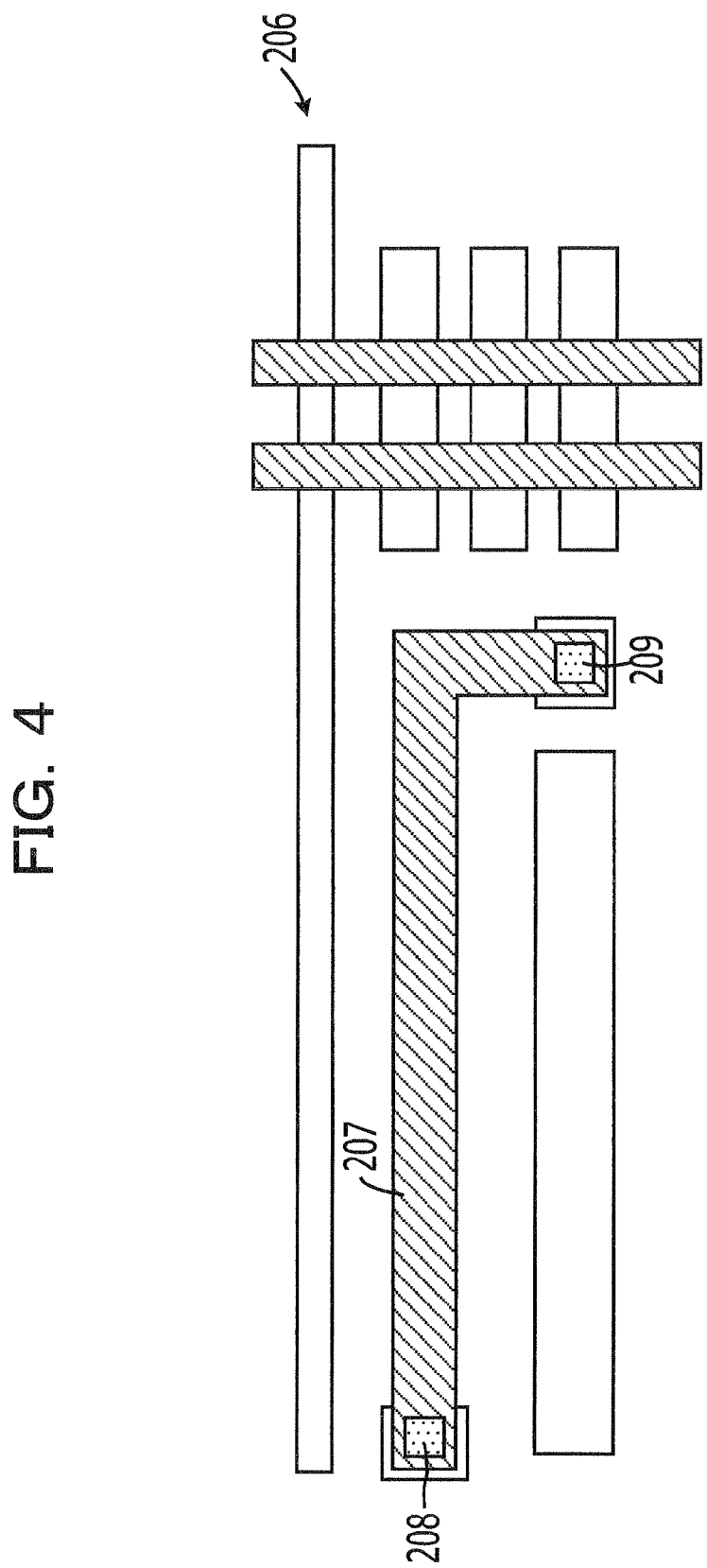
FIG. 4 illustrates exemplary single via holes.

FIG. 4 illustrates exemplary single via holes. The circuit information 206 illustrates part of the layout data of a design target circuit. Target wiring 207 in the circuit information 206 is coupled to wiring in a lower layer by a via hole 208, and is coupled to wiring different from the wiring in the lower layer by a via hole 209. Since the area of the target wiring 207 is large with reference to a via hole, each of the target wiring 207 and the via holes 208 and 209 may be a failure. For example, there is no wiring area in the same layer and the lower layer on either side of the via hole 209. Since the target wiring 201 and the wiring in the lower layer may not be coupled via multiple via holes, the via hole 209 may be a single via hole.

Areas coupled each other via a single via hole may be set to areas not to be coupled each other via multiple via holes. It may be detected whether or not the areas coupled each other via the single via hole may be coupled each other via multiple via holes.

Figure 5:
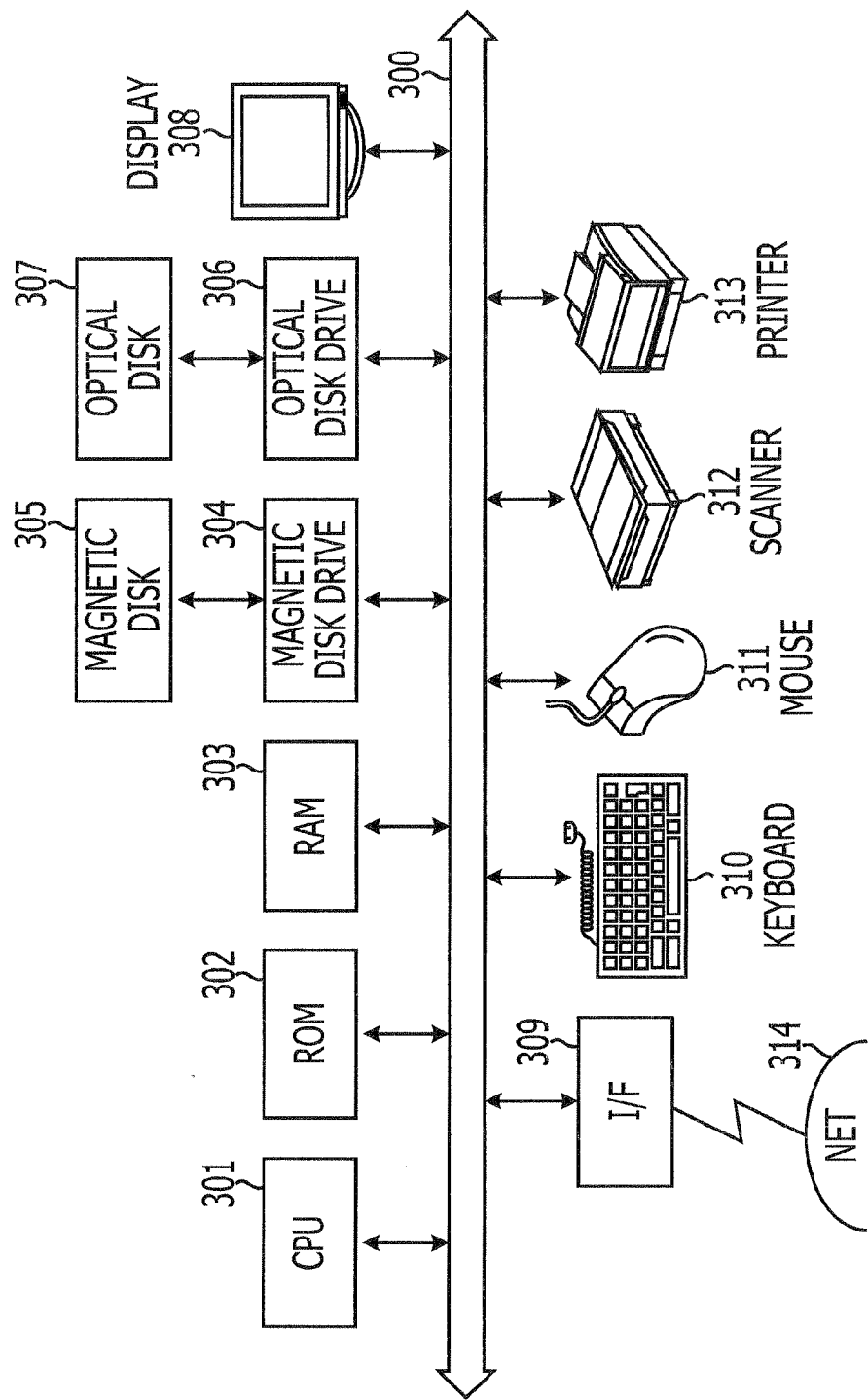
FIG. 5 illustrates an exemplary design support system.

FIG. 5 illustrates an exemplary design support system. The design support system illustrated in FIG. 5 includes a central processing unit (CPU) 301, a read-only memory (ROM) 302, a random access memory (RAM) 303, a magnetic disk drive 304, a magnetic disk 305, an optical disk drive 306, an optical disk 307, a display 308, an interface (I/F) 309, a keyboard 310, a mouse 311, a scanner 312, and a printer 313. The above-described elements are coupled to one another via a bus 300.

The CPU 301 controls the design support system. The ROM 302 stores programs including a design support program, the program of an automatic arrangement-and-wiring tool, for example. The RAM 303 may be used as the working area of the CPU 301. The magnetic disk drive 304 controls reading and/or writing data from and/or onto the magnetic disk 305. The magnetic disk 305 stores data written under the control of the magnetic disk drive 304.

The optical disk drive 306 controls reading and/or writing data from and/or onto the optical disk 307. The optical disk 307 stores data written under the control of the optical disk drive 306, and a computer reads the data stored on the optical disk 307.

The display 308 displays data of a cursor, an icon, a tool box, text, and an image, functional information, etc. The display 308 includes, for example, a CRT, a TFT liquid crystal display, a plasma display, for example.

The I/F 309 is coupled to a network 314 including a local area network (LAN), a wide area network (WAN), the Internet, etc., and is coupled to a different system via the network 314. The I/F 309 interfaces between the network 314 and the elements included in the design support system to control input of data from an external device and output of data to the external device. The I/F 309 includes a modem, a LAN adaptor, for example.

The keyboard 310 includes keys for inputting text, numerals, various types of instructions, for example. The keyboard 310 may include, for example, a touch-panel input pad or a touch-panel numeric keypad. The mouse 311 moves a cursor or a window, select an area, or change a window size. The mouse 311 includes a pointing device, a track ball, a joystick, for example.

The scanner 312 optically reads image data, and captures the image data into the design support system. The scanner 312 may include an optical character reader (OCR) function. The printer 313 prints image data or text data. The printer 313 includes, for example, a laser printer or an inkjet printer.

Figure 6:
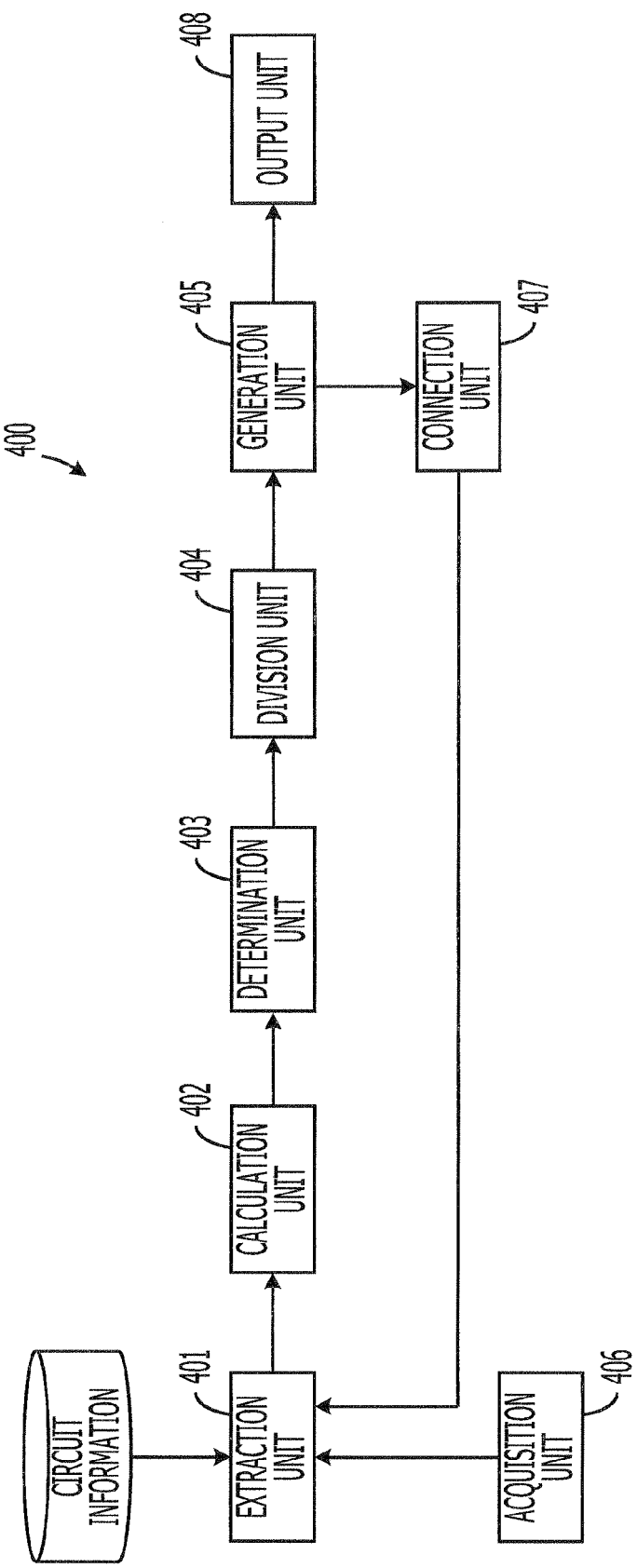
FIG. 6 illustrates an exemplary design support system.

FIG. 6 illustrates an exemplary design support system. The design support system 400 includes an extraction unit 401, a calculation unit 402, a determination unit 403, a division unit 404, a generation unit 405, an acquisition unit 406, a connection unit 407, and an output unit 408. For example, the CPU 301 executes a program stored in storage including the ROM 302, the RAM 303, the magnetic disk 305, the optical disk 307, etc. so that the extraction unit 401, the calculation unit 402, the determination unit 403, the division unit 404, the generation unit 405, the acquisition unit 406, the connection unit 407, and the output unit 408 operate.

Circuit information may include a single via hole for coupling target wiring to wiring provided in a different layer.

The single via hole is extracted from the circuit information and the target wiring is divided so that an area of the target wiring corresponding to the single via hole is optimized.

Figure 7:
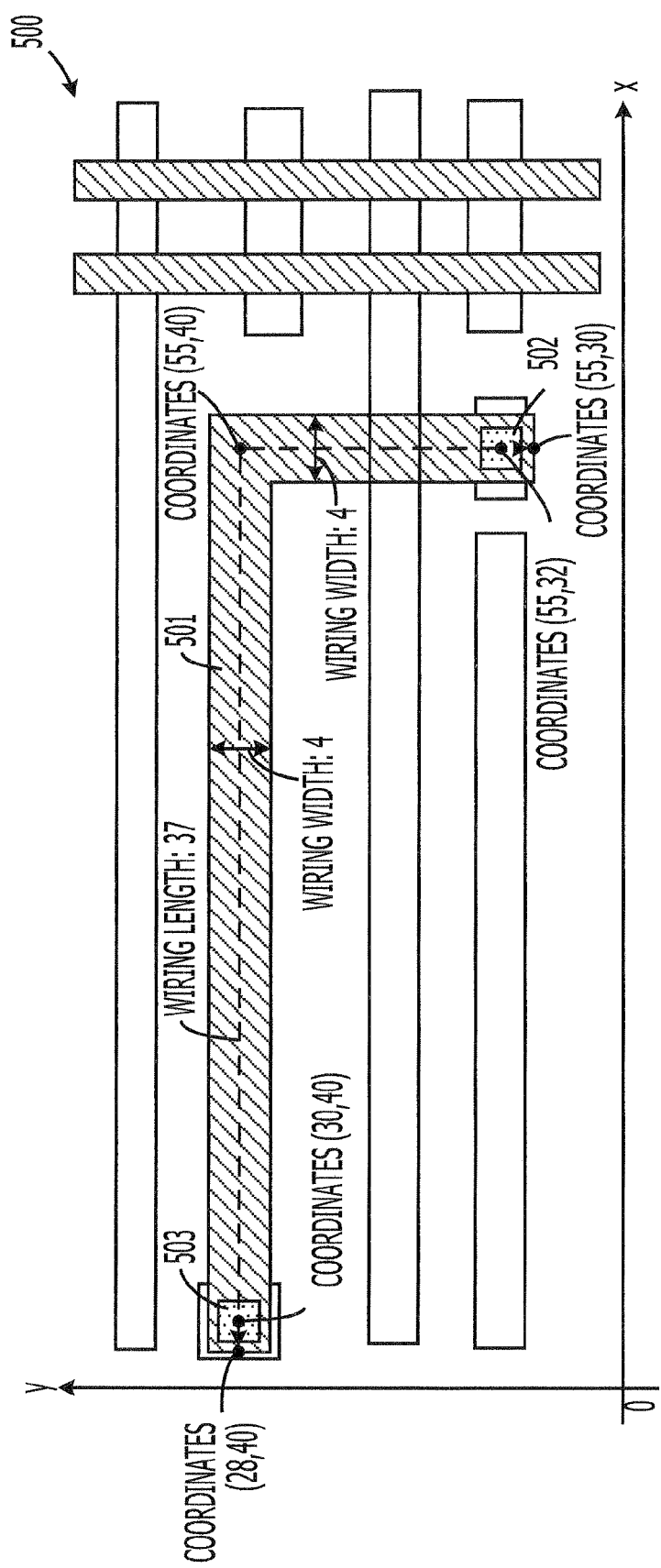
FIG. 7 illustrates exemplary circuit information.

FIG. 7 illustrates exemplary circuit information. The circuit information 500 illustrates a part of layout data of a design target circuit. Target wiring 501 may be a part of a net which is referred to as a net1 in the design target circuit and couples elements to each other. The target wiring 501 is coupled to wiring in a lower layer at the coordinates 55 and 32 by a via hole 502, and is coupled to wiring in the lower layer at the coordinates 30 and 40 by a via hole 503.

The length of the target wiring 501 may be calculated based on the coordinates of the target wiring 501 and the calculated length may be included in the circuit information 500 as the length information. The length of the target wiring 501 may be the result of adding the length of from the coordinates 28 and 40 to the coordinates 55 and 40 to the length of from the coordinates 55 and 40 to the coordinates 55 and 30. The length of the target wiring 501 may be, for example, 37. The wiring width of the target wiring 501 may be "4". The circuit information 500 may be stored in storage including the RAM 303, the magnetic disk 305, the optical disk 307, etc., which is accessible by the CPU 301.

Figure 8:
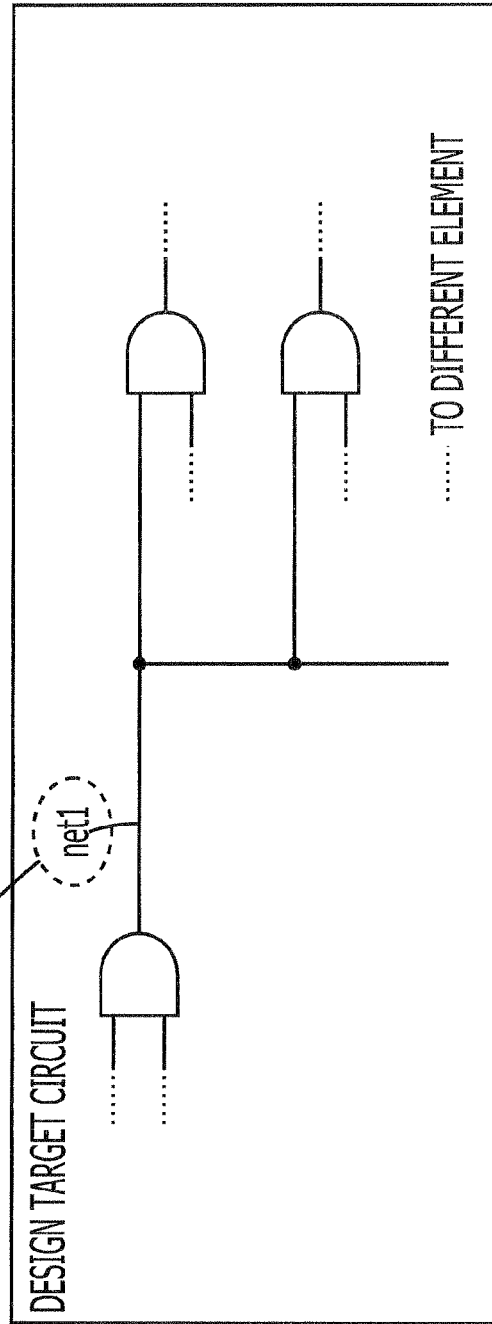
FIG. 8 illustrates exemplary circuit information.

FIG. 8 illustrates exemplary circuit information. Table data 504 may illustrate the circuit information 500 illustrated in FIG. 7. The table data 504 includes, for example, layer name data 505, net name data 506, wiring width data 507, coordinate data 508, and wiring length data 509. The table data 504 includes the target wiring 501 illustrated in FIG. 7. According to the target wiring 501, the layer name data 505 is METAL3, the net name data 506 is net1, the wiring width data 507 is "4", and the coordinate data 508 includes a wiring from coordinates 28 and 40 to the coordinates 55 and 40, and a wiring of a point from the coordinates 55 and 40 to the coordinates 55 and 30.

A via hole 23 is arranged at the position corresponding to the coordinates 30 and 40 and the position corresponding to the coordinates 55 and 32. The via hole 23 may be a via hole coupling the layer METAL2 to the layer METAL3. The via hole 23 arranged at the position corresponding to the coordinates 30 and 40 may be the via hole 502 included in the circuit information 500. The via hole 23 arranged at the position corresponding to the coordinates 55 and 32 may be the via hole 503 included in the circuit information 500. Since the circuit information includes information about the net name of the design target circuit, the divided target wiring is identified based on the net name.

The circuit information 500 includes the wiring length data 509 and the wiring width data 507 that are illustrated in the table data 504. The circuit information 500 may include information about the wiring area for each wiring. When the circuit information 500 includes the information about the wiring area, the calculating unit 400 may not execute process.

The extraction unit 401 illustrated in FIG. 6 extracts one or more via holes for coupling arbitrary target wiring to wiring provided in a different layer included in the circuit information. For example, the CPU 301 accesses the storage, reads the circuit information 500, and selects the target wiring 501 illustrated in the circuit information 500. Each of the via holes 502 and 503 is extracted as a single via hole coupling the target wiring 501 to wiring in a different layer.

For example, when the CPU 301 selects a via hole coupling the target wiring 501 to the wiring provided in the lower layer and the arbitrary via hole is provided away from a different via hole by a certain distance, the arbitrary via hole is extracted as the single via hole. The extraction result may be stored in storage including the RAM 303, the magnetic disk 305, the optical disk 307, for example.

The calculation unit 402 calculates the area of the target wiring based on the length and width of the target wiring included in the circuit information. For example, the CPU 301 calculates the area of the target wiring 501 based on the length and width of the target wiring 501 included in the circuit information 500. The length of the target wiring 501 may be 37. The width of the target wiring 501 may be 4. The area of the target wiring 501 may be 148. The calculation result may be stored in storage including the RAM 303, the magnetic disk 305, the optical disk 307, for example.

The determination unit 403 determines the division condition based on the area of the target wiring calculated by the calculation unit 402, and the number of single via holes extracted by the extraction unit 401. When the wiring area per an individual via hole is equivalent to a certain value or less, each of the target wiring and the via holes may not be determined to be a failure. The certain value may be 50.

The CPU 301 calculates the area of the target wiring 501 per via hole based on the area of the target wiring 501 and the number of the single via holes. The value of the area of the target wiring 501 may be 148, and the single via holes may be the via holes 502 and 503. The area of the target wiring 501 per a single via hole may be 74.

The CPU 301 determines whether or not the area of the target wiring 501 per a single via hole is equivalent to the certain value or less. When the area value is equivalent to the certain value or less, the target wiring 501 may not be divided. When the area value is larger than the certain value, the target wiring 501 may be divided. Since the area value of the target wiring 501, which is 74, is larger than the certain value determined to be 50, the target wiring 501 may be divided. The determination result may be stored in storage including the RAM 303, the magnetic disk 305, the optical disk 307, for example.

The division unit 404 divides the target wiring at a position other than the position where a via hole is arranged based on the division condition. The CPU 301 reads the division condition from the storage and divides the target wiring 501 at a position other than that where a via hole is arranged so that the length of the target wiring 501 may be reduced by half.

The generation unit 405 generates information indicating the connection relationship between the wiring parts obtained by the division and limitation information for coupling wirings using wiring in a different layer.

The CPU 301 generates information about the coordinates of the wiring for coupling the divided wirings as information indicating the connection relationship. Information about the name of a layer lower than the layer of the target wiring 501 and the name of a layer higher than the layer of the target wiring 501 is generated as the limitation information for coupling the divided wirings using wiring in a layer different from a layer where the divided wirings are provided. Since the target wiring 501 is provided in the layer METAL3, limitation information including information about the layers METAL2 and METAL4 is generated.

The output unit 408 outputs the circuit information obtained after the division, and the connection relationship information and the limitation information that are generated by the generation unit 405. The CPU 301 outputs the circuit information after the division and the information indicating the connection relationship between the divided wiring. The information may be displayed on the display 308, printed through the printer 313, or outputted to an external device through the I/F 309. The information may be stored in the storage including the RAM 303, the magnetic disk 305, and the optical disk 307.

Figure 9:
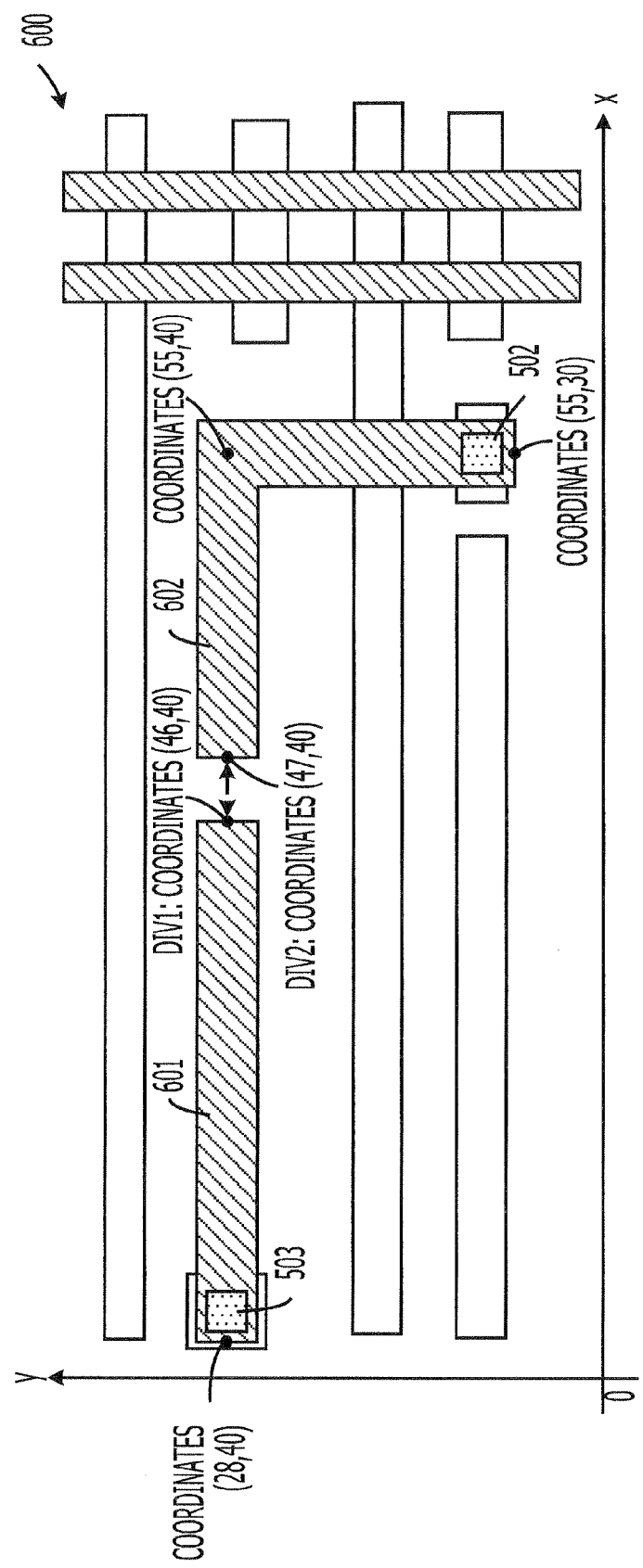
FIG. 9 illustrates exemplary circuit information.

FIG. 9 illustrates exemplary circuit information. The output unit 408 illustrated in FIG. 6 may output circuit information 600 illustrated in FIG. 9. According to the circuit information 600, the target wiring 501 in the circuit information 500 is divided into target wiring 601 and target wiring 602. The target wiring 601 and target wiring 602 are coupled to each other at positions DIV1 and DIV2. Information about the coordinates of each of the positions DIV1 and DIV2 may be information illustrating the connection relationship between the target wiring 601 and the target wiring 602.

FIG. 10 illustrates exemplary circuit information. The circuit information illustrated in FIG. 9 may be the circuit information 600 illustrated in FIG. 9. The table data 604 may include the wiring information obtained after the wiring division. The layer name data 505 may be "METAL3", the net name data 506 may be "net1", the wiring width data 507 may be "4", and the wiring indicated by the coordinate data 508 from the coordinates 28 and 40 to the coordinates 46 and 40 may be the target wiring 601 illustrated in FIG. 9. The layer name data 505 may be "METAL3", the net name data 506 may be "net1", the wiring width data 507 may be 4, and the wiring indicated by the coordinate data 508 from the coordinates 47 and 40 to the coordinates 55 and 40 and from the coordinates 55 and 40 to the coordinates 55 and 30 may be the target wiring 602 illustrated in FIG. 9.

Each of the target wiring 601 and the target wiring 602 has the net name data 506 "net1". The circuit information 600, information about the coordinates of each of the positions DIV1 and DIV2, and the limitation information of each of the layers METAL2 and METAL4 are supplied to the automatic arrangement-and-wiring tool. The target wiring 601 and the target wiring 602 are coupled to each other by a via hole and wiring in a different layer by the automatic arrangement-and-wiring tool.

Figure 11:
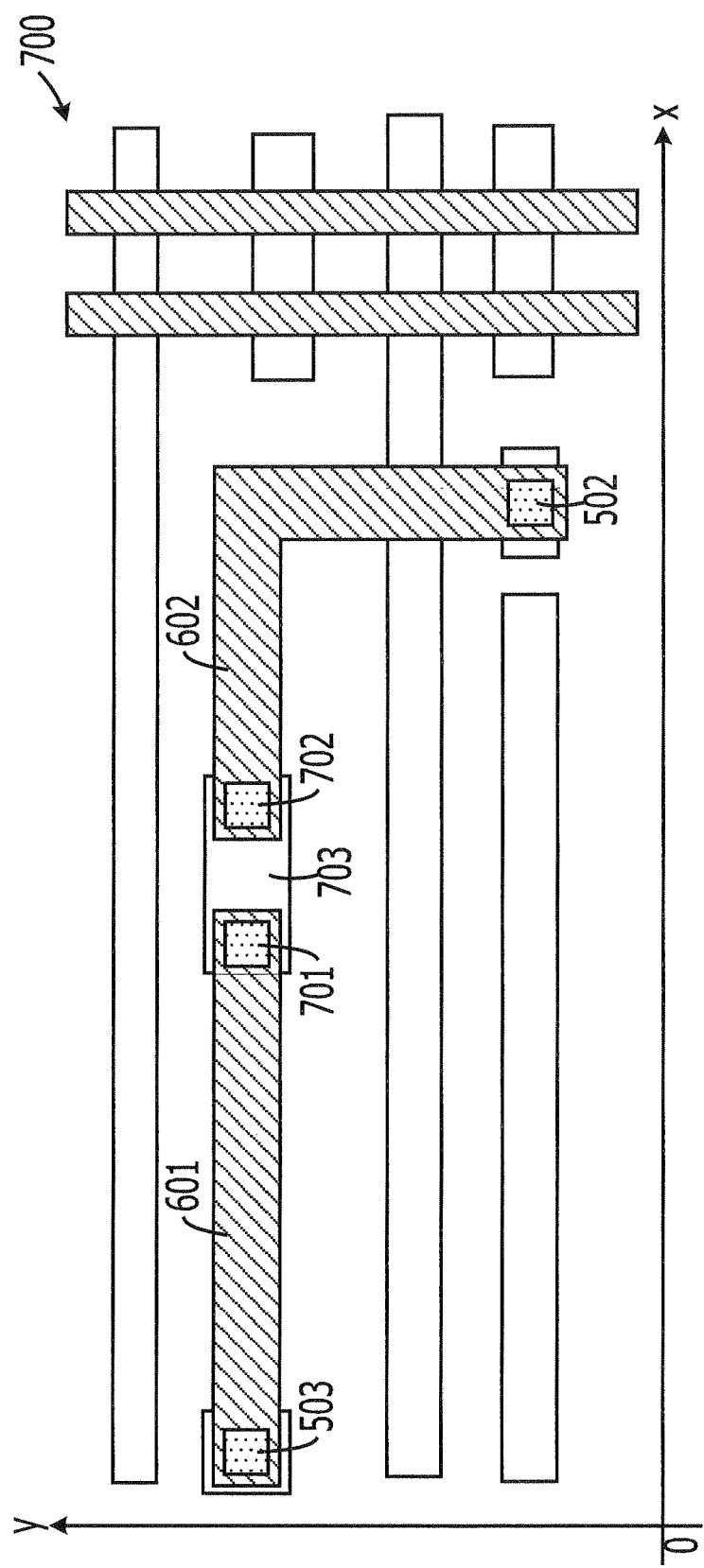
FIG. 11 illustrates an exemplary connection.

FIG. 11 illustrates an exemplary connection. In FIG. 11, the target wiring 601 and the target wiring 602 are coupled to each other. According to circuit information 700, the target wiring 601 and the target wiring 602 are coupled to each other through via holes 701 and 702 and wiring 703 in a lower layer. The area of the target wiring per via hole may be reduced and the influence of the stress migration may be reduced. Although the target wiring 601 is coupled to wiring 703 in a lower layer via the via hole 701, the target wiring 601 may be coupled to the wiring 703 via at least two via holes. Although the target wiring 602 is coupled to the wiring 703 in the lower layer via the via hole 702, the target wiring 602 may be coupled to the wiring 703 via at least two via holes. The influence of the stress migration may be reduced.

The acquisition unit 406 acquires the circuit information obtained after the division and the circuit information including the wirings divided based on the connection relationship information and the limitation information, which are generated by the generation unit 405, are coupled to each other through a via hole and wiring in a different layer from the automatic arrangement-and-wiring tool.

The CPU 301 executes the program of the automatic arrangement-and-wiring tool, which is stored in the storage. The circuit information obtained after the target wiring 501 is divided, the connection relationship information, and the limitation information are input to the automatic arrangement-and-wiring tool. The circuit information 700 indicating that the target wiring 601 and the target wiring 602 are coupled to each other at the positions DIV1 and DIV2 via the layer METAL2 is acquired from the automatic arrangement-and-wiring tool.

The extraction unit 401 selects the divided wiring as the target wiring from the circuit information acquired by the acquisition unit 406 and extracts at least one via hole for coupling the target wiring to wiring in a different layer. The number of via holes may be equivalent to or less than a certain number. The CPU 301 selects the target wiring 601 from the circuit information 700 as the target wiring. A single via hole for coupling the target wiring 601 to the wiring in the different layer is extracted.

The process performed by the calculation unit 402, the determination unit 403, the division unit 404, and the generation unit 405 are repeatedly performed until the wiring area per a single via hole becomes equivalent to or less than a certain value. The wiring area per a single via hole is optimized and failures may be reduced.

The design support device 400 may establish the connection between the wirings.

The connection unit 407 illustrated in FIG. 6 establishes the connection between divided wirings by a via hole and wiring in a different layer based on the connection relationship information and the limitation information that are generated by the generation unit 405. The connection relationship information may include the coordinates of each of the positions DIV1 and DIV2. The limitation information may include the layer METAL2 or the layer METAL4.

The CPU 301 searches the circuit information 600 for wiring in the layer METAL2 which passes through the coordinates of each of the positions DIV1 and DIV2. If the wiring is not found by the search, the via hole 701 is arranged in the target wiring 601 according to the via hole-arrangement rule described in the design rule based on the coordinates of the position DIV1, and the via hole 702 is arranged in the target wiring 602. Wiring that may be coupled to each of the via holes 701 and 702 is arranged in the layer METAL2. The connection result may be stored in storage including the RAM 303, the magnetic disk 305, the optical disk 307, for example.

The extraction unit 401 determines selects divided wiring as a target wiring from the circuit information coupled by the connection unit 407 and extracts at least one via hole for coupling the target wiring to wiring in a different layer. The number of via holes may be equivalent to or less than a certain number. The function is substantially the same as or similar to that of the extraction unit 401.

When the circuit information includes a small number of divided wirings, a user may establish the connection between the divided wirings.

When the automatic arrangement-and-wiring tool or the connection unit 407 does not establish the connection between the divided wiring, the output unit 408 outputs information indicating that no connection is established between the divided wirings.

Figure 12:
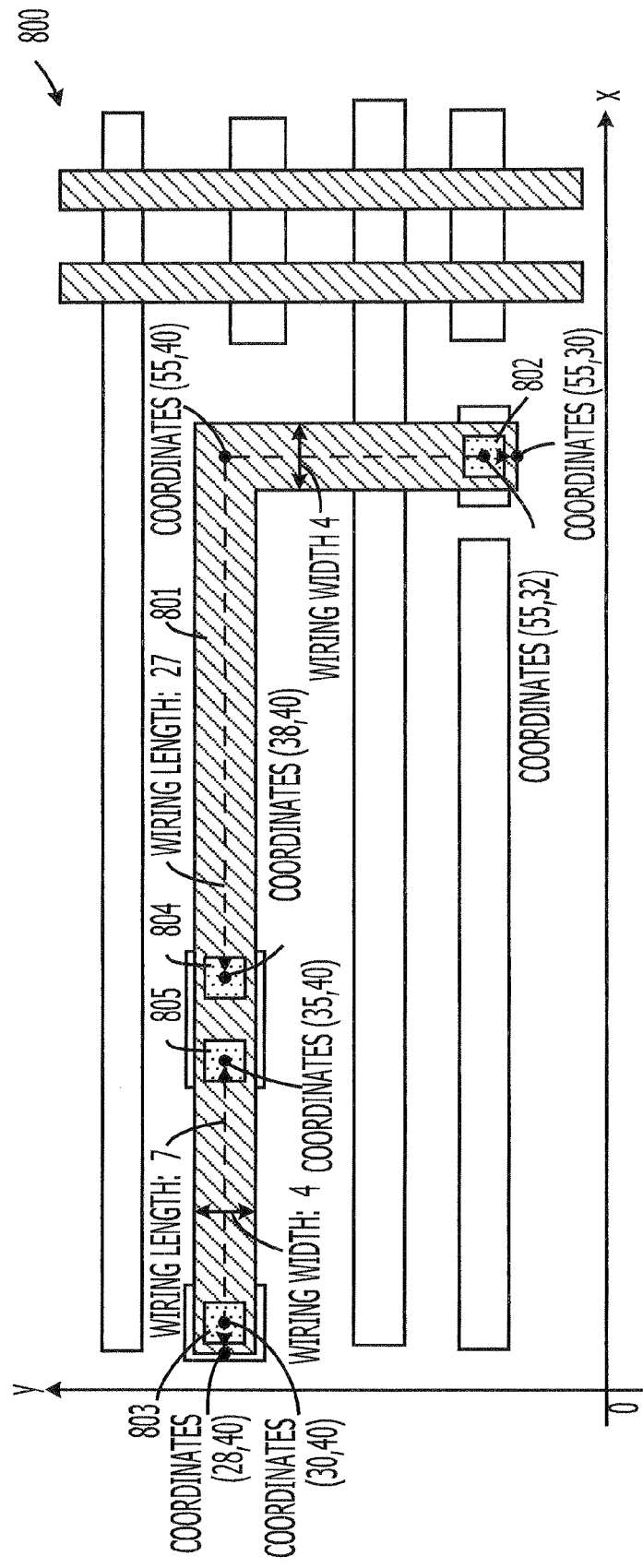
FIG. 12 illustrates exemplary circuit information.

FIG. 12 illustrates exemplary circuit information. The circuit information 800 illustrated in FIG. 12 800 may be part of the layout data of a design target circuit. Target wiring 801 may be part of a net in the design target circuit which is referred to as a net2 and couples between elements. The target wiring 801 is coupled to wiring in a lower layer at a position corresponding to the coordinates 55 and 30 by a via hole 802, and is coupled to wiring in a lower layer at the position corresponding to the coordinates 30 and 40 by a via hole 803. Each of the via holes 802 and 803 may be a single via hole.

The target wiring 801 is coupled to wiring in a lower layer at the position corresponding to the coordinates 38 and 40 by a via hole 804 and at the position corresponding to the coordinates 35 and 40 by a via hole 805. The via holes 804 and 805 may be multiple via holes. The width of target wiring 801 may be 4. The circuit information 800 may be stored in storage including the RAM 303, the magnetic disk 305, the optical disk 307, etc., which is accessible by the CPU 301.

The extraction unit 401 illustrated in FIG. 6 selects arbitrary wiring included in circuit information of the design target circuit as target wiring for every multiple via holes, and extracts a single via hole for coupling the target wiring to wiring in a different layer. The CPU 301 reads the circuit information 800 from the storage and selects the target wiring 801 in the circuit information 800. Arbitrary wiring is selected for every multiple via holes of the target wiring 801. Wiring extending from the position of the via hole 804 in the target wiring 801 to the position corresponding to the coordinates 55 and 30 may be selected.

The length of target wiring may be calculated based on the coordinates of the wiring and the coordinates of the via hole. The length of from the via hole 804 corresponding to the coordinates 38 and 40 to the coordinates 55 and 30 may be 27, and the width and the area of the target wiring 801 may be 4 and 108, respectively.

The certain value may be 50. The area of the target wiring may be 108 and the target wiring is divided into wirings.

It is checked whether or not the target wiring 801 from the coordinates 28 and 40 to the position of the via hole 805 in the circuit information 800 be divided. Since the area of the target wiring 801 from the coordinates 28 and 40 to the via hole 805 corresponding to the coordinates 35 and 40 is 50 or less, the target wiring 801 may not be divided.

Figure 13:
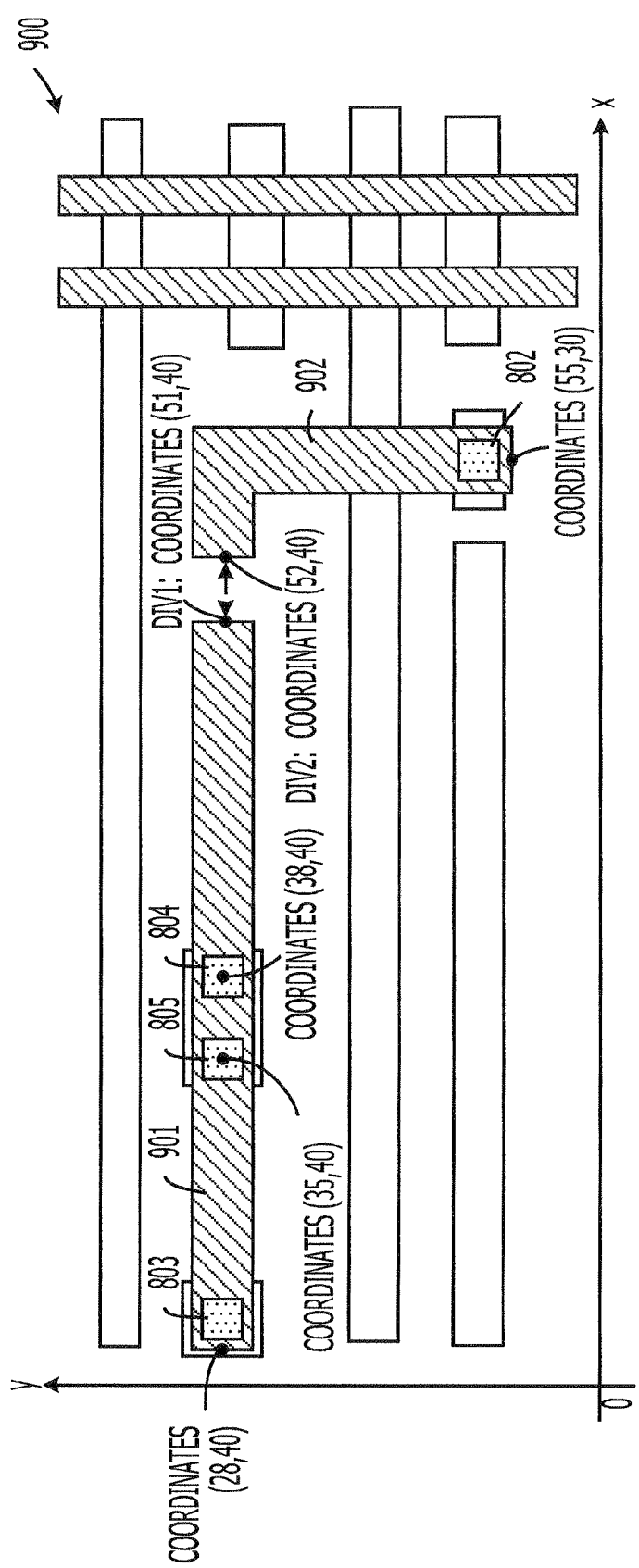
FIG. 13 illustrates exemplary circuit information.

FIG. 13 illustrates exemplary circuit information. According to circuit information 900, the target wiring 801 from the via hole 804 corresponding to the coordinates 38 and 40 to the coordinates 55 and 30 in the circuit information 800 is divided into two wirings. The target wiring 801 extending from the coordinates 28 and 40 to the via hole 805 corresponding to the coordinates 35 and 40 in the circuit information 800 may not be divided. The target wiring 801 is divided into target wiring 901 and target wiring 902.

The target wiring 901 and the target wiring 902 are coupled to each other at the positions DIV1 and DIV2. Information about the coordinates of each of the positions DIV1 and DIV2 may be information about the connection relationship between the target wiring 901 and the target wiring 902.

The acquisition unit 406 illustrated in FIG. 6 acquires circuit information indicating that divided wirings are coupled to each other by a via hole and wiring in a different layer by the automatic arrangement-and-wiring tool.

Figure 14:
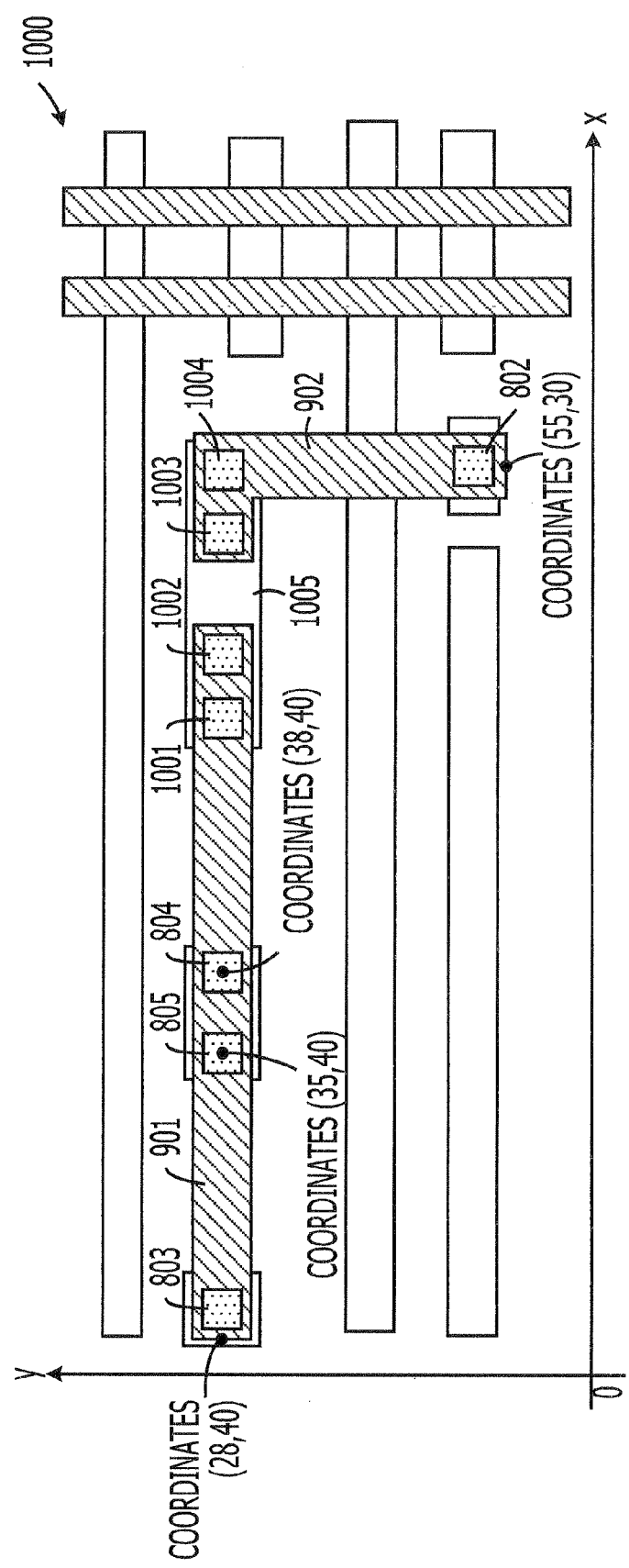
FIG. 14 illustrates exemplary circuit information.

FIG. 14 illustrates exemplary circuit information. According to circuit information 1000, the target wiring 901 and the target wiring 902 are coupled to each other via wiring in a lower layer. The target wiring 901 is coupled to wiring 1005 in a lower layer through via holes 1001 and 1002, and the lower wiring 1005 is coupled to the target wiring 902 through via holes 1003 and 1004 so that the target wiring 901 and the target wiring 902 are coupled to each other. The process performed by the extraction unit 401, the calculation unit 402, the determination unit 403, the division unit 404, the generation unit 405, the acquisition unit 406, the connection unit 407, and the output unit 408 are repeatedly performed so that the area of the target wiring per via hole is optimized. Consequently, failures may be reduced.

The certain number may be at least one, or it may be another suitable number.

Figure 15:
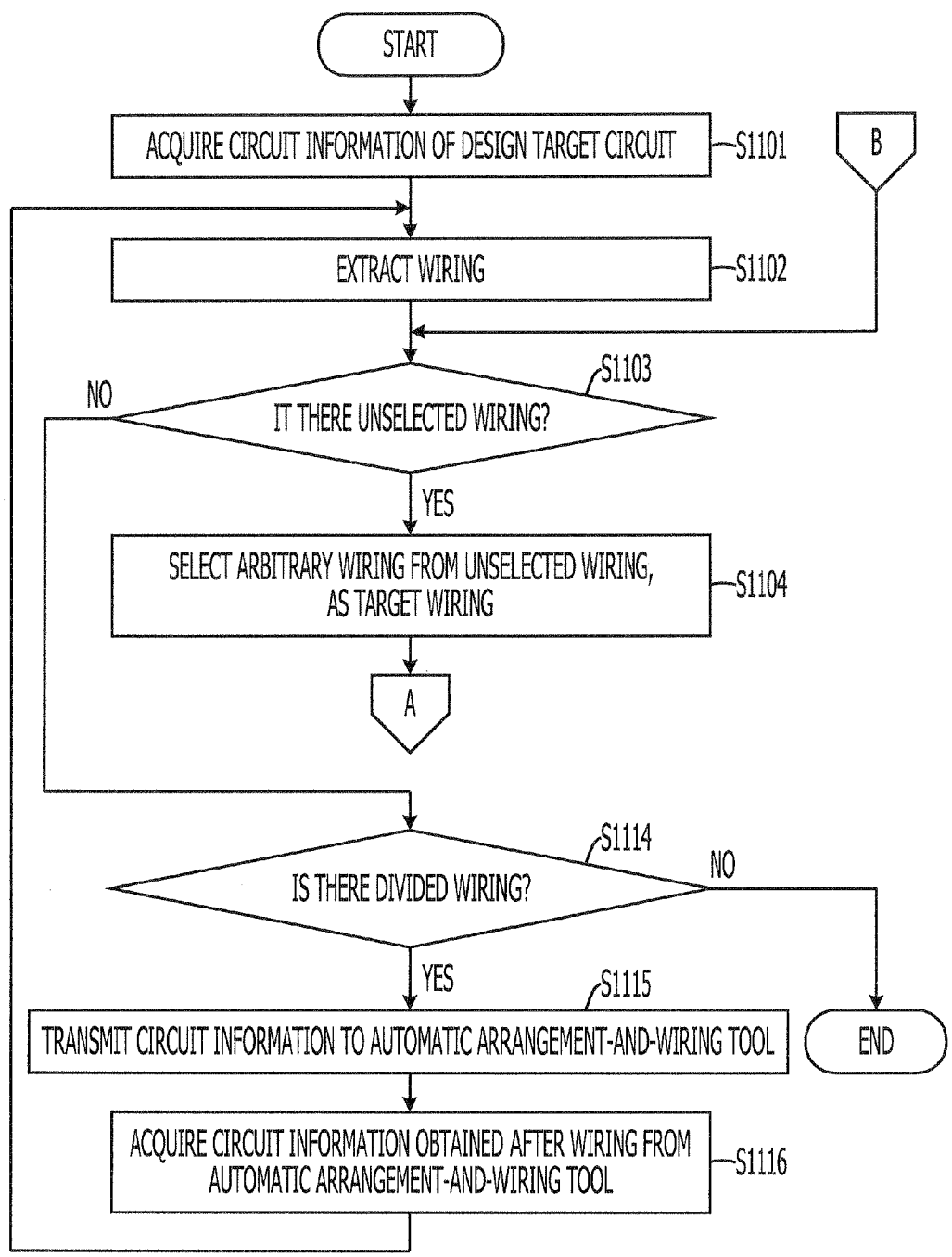
FIG. 15 illustrates an exemplary design support process.
Figure 16:
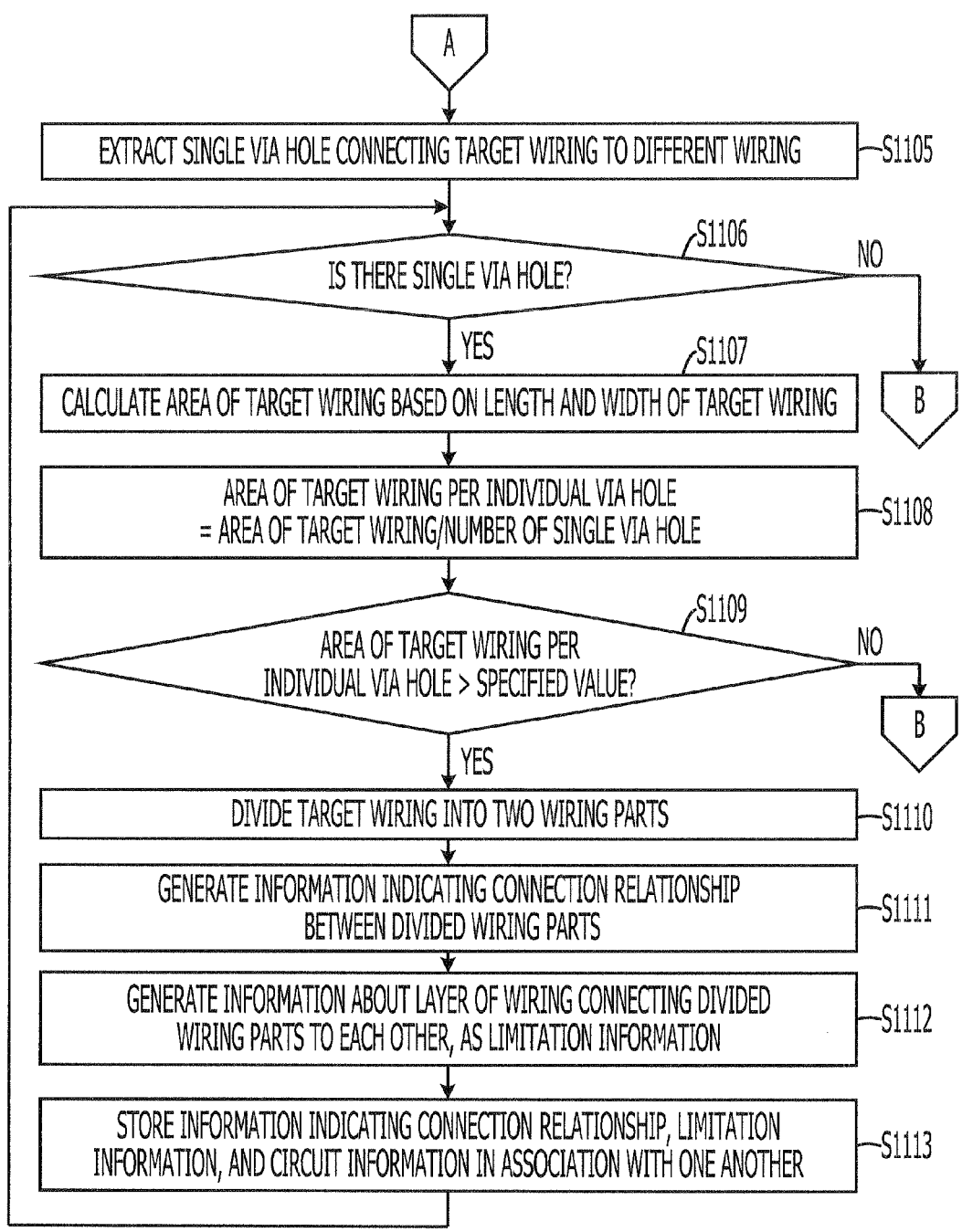
FIG. 16 illustrates an exemplary design support process.

Each of FIGS. 15 and 16 illustrates exemplary design support process. The design support process may be executed by the design support system 400 illustrated in FIG. 6. The circuit information of a design target circuit is acquired at operation S1101 and wiring is extracted from the circuit information at operation S1102. For example, the circuit information 500 may be acquired and wiring may be extracted from the circuit information 500.

It is checked whether or not there is unselected wiring at operation S1103. If there is an unselected wiring (operation S1103: Yes), arbitrary wiring is selected from the unselected wiring as target wiring at operation S1104. For example, the target wiring 501 in the circuit information 500 may be selected as the target wiring.

A single via hole coupling the target wiring to wiring in a different layer is extracted at operation S1105. It is checked whether or not there is a single via hole at operation S1106. The via holes 502 and 503 that couple the target wiring 501 to wiring in a lower layer may be extracted.

When there is a single via hole (operation S1106: Yes), the area of the target wiring is calculated based on the length and the width of the target wiring included in the circuit information at operation S1107. For example, the length of the target wiring 501 may be 37, the width of the target wiring 501 may be 4, and the area of the target wiring 501 may be 148.

A calculation is performed according to the equation, the wiring area per via hole=the area of target wiring/the number of via holes, at operation S1108. It is checked whether or not the area of the target wiring per via hole is larger than a certain value of the wiring area per via hole, at operation S1109. For example, the area of the target wiring 501 may be 148 and the number of extracted via holes may be 2. The wiring area per via hole may be 74. When the certain value is 50, for example, the area of the target wiring 501 per via hole is larger than the certain value.

When the wiring area per via hole is larger than the specified value (operation S1109: Yes), the target wiring is divided into two wirings at a position other than the position where a via hole is provided at operation S1110. For example, when the area of the target wiring 501 per via hole is larger than the certain value, the target wiring 501 may be divided into two wirings. Circuit information obtained after the target wiring 501 is divided may be the circuit information 600.

Information indicating the connection relationship between the divided wirings is generated at operation S1111. Information about the layer of wiring for coupling the divided wirings to each other is generated as the limitation information at operation S1112. For example, the divided wirings may be the target wiring 601 and the target wiring 602. For example, information indicating the connection relationship may be information about the positions DIV1 and DIV2. Since the name of the layer where the target wiring 601 and the target wiring 602 are provided is METAL3, information about the layer name METAL2 or the layer name METAL4 may be generated.

The connection relationship information, the limitation information, and the circuit information are stored in association with one another at operation S1113. The process returns to operation S1106.

When the wiring area per via hole is not larger than the certain value (operation S1109: No), the process returns to operation S1103 illustrated in FIG. 15. When the wiring area per via hole is equivalent to the certain value or less, a failure of the wiring or the via hole under the influence of the stress migration may be low. When there is no single via hole (operation S1106: No), the process returns to operation S1103 illustrated in FIG. 15.

When there is no unselected wiring (operation S1103: No), it is checked whether or not there is divided wiring at operation S1114.

When there is a divided wiring (operation S1114: Yes), circuit information is supplied to the automatic arrangement-and-wiring tool at operation S1115. Circuit information obtained after wiring is acquired from the automatic arrangement-and-wiring tool at operation S1116, and the process returns to operation S1102. For example, the circuit information acquired from the automatic arrangement-and-wiring tool may be the circuit information 700.

When there is no divided wiring (operation S1114: No), the process is finished. The wiring area corresponding to a single via hole is optimized and failures may be reduced.

A design support program is stored in a computer-readable recording medium including a hard disk, a flexible disk, a CD-ROM, an MO, a DVD, etc. A computer may read the design support program from the recording medium for execution. The design support program may be distributed via a network including the Internet or the like.

Example embodiments of the present invention have now been described in accordance with the above advantages. It will be appreciated that these examples are merely illustrative of the invention. Many variations and modifications will be apparent to those skilled in the art.

The invention claimed is:

1. A non-transitory computer-readable recording medium that stores therein a design support program, the design support program enabling a computer to execute:
    extracting a target wiring in a first layer in circuit information;
    calculating an area of the target wiring based on a length and a width of the target wiring;
    determining a division condition based on the area of the target wiring and a number of first via holes coupled to the target wiring;
    dividing the target wiring into divided wirings at a position other than a position where the first via holes are provided based on the division condition;
    coupling the divided wirings through second via holes and a wiring in a second layer, wherein the second layer is different from the first layer;
    generating connection information indicating a connection relationship between the divided wirings and limitation information for coupling the divided wirings via the wiring in a the second layer; and
    outputting the connection information, the limitation information and circuit information obtained after dividing.

2. The non-transitory computer-readable recording medium according to claim 1,
    wherein the circuit information includes the area of each wiring in the circuit information, and
    wherein the division condition is determined for each wiring in the circuit information.

3. The non-transitory computer-readable recording medium according to claim 1, the design support program further enabling the computer to execute:
    acquiring circuit information indicating connection of the divided wirings based on the connection information and the limitation information;
    extracting one of the divided wirings in the circuit information as the target wiring; and determining the division condition based on the area of the target wiring and a number of via holes coupled to the target wiring.

4. A design support system comprising:
an extraction unit that extracts a target wiring in a first layer in circuit information;
a calculation unit that calculates an area of the target wiring based on a length and a width of the target wiring;
a determination unit that determines a division condition based on the area of the target wiring and a number of first via holes coupled to the target wiring;
a division unit that divides the target wiring into divided wirings at a position other than a position where the first via holes are provided based on the division condition;
a generation unit that generates connection information indicating a connection relationship between the divided wirings and limitation information for coupling the divided wirings through second via holes and a wiring in a second layer, wherein the second layer is different from the first layer; and
an output unit that outputs the connection information, the limitation information, and circuit information obtained after dividing.

5. A design support method, comprising:
executing by a computer operations of:
extracting a target wiring in a first layer in circuit information;
calculating an area of the target wiring based on a length and a width of the target wiring by the computer;
determining a division condition based on the area and a number of first via holes coupled to the target wiring;
dividing the target wiring into divided wirings at a position other than a position where the first via holes are provided based on the division condition;
generating connection information indicating a connection relationship between the divided wirings and limitation information for coupling the divided wirings through second via holes and a wiring in a second layer, wherein the second layer is different from the first layer; and
outputting the connection information, the limitation information, and circuit information obtained after dividing.

* * * * *

UNITED STATES PATENT AND TRADEMARK OFFICE
CERTIFICATE OF CORRECTION

| | |
|---|---|
| PATENT NO. | : 8,468,481 B2 |
| APPLICATION NO. | : 12/842710 |
| DATED | : June 18, 2013 |
| INVENTOR(S) | : Toshiharu Nozawa et al. |

It is certified that error appears in the above-identified patent and that said Letters Patent is hereby corrected as shown below:

Title Page, item (54) and in the specification, Column 1, line 1, correct the Title to read as follows:

-- DESIGN SUPPORT PROGRAM, DESIGN SUPPORT SYSTEM, AND DESIGN SUPPORT METHOD --

Signed and Sealed this
Thirteenth Day of August, 2013

Teresa Stanek Rea
*Acting Director of the United States Patent and Trademark Office*